United States Patent [19]

Hamilton et al.

[11] 4,277,702

[45] Jul. 7, 1981

[54] CHARGE COMPARATOR OUTPUT DRIVER

[75] Inventors: James M. Hamilton, Hawthorne, Calif.; Arthur J. Porter, Eugene, Oreg.

[73] Assignee: Hughes Aircraft Company, Culver City, Calif.

[21] Appl. No.: 106,222

[22] Filed: Dec. 21, 1979

[51] Int. Cl.³ .................... H03K 3/353; G11C 19/28; H03K 5/153; H01L 29/78

[52] U.S. Cl. ............... 307/304; 307/221 D; 307/362; 307/DIG. 3; 357/24

[58] Field of Search ................. 307/221 D, 304, 362, 307/DIG. 3; 357/24

[56] References Cited

U.S. PATENT DOCUMENTS

| | | | |
|---|---|---|---|
| 4,021,682 | 3/1977 | Elmer et al. | 307/221 D |
| 4,135,104 | 1/1979 | Allen | 307/221 D |
| 4,150,304 | 4/1979 | Jensen | 307/221 D |

Primary Examiner—Gene M. Munson
Attorney, Agent, or Firm—Robert M. Wallace; William H. MacAllister

[57] ABSTRACT

Charge refreshment in a charge transfer device is accomplished by a charge comparator in which charge is ejected over the lower one of two potential barriers, one of the potential barriers having a height controlled by input charge packets to be refreshed, the other potential barrier establishing a reference level for the comparison. The device includes a bistable latch to increase the comparison speed, the feedback nodes of the latch being isolated from the output nodes of the charge refresher comparator so that substantially none of the output charge is diverted to furnish feedback for the latch.

6 Claims, 11 Drawing Figures

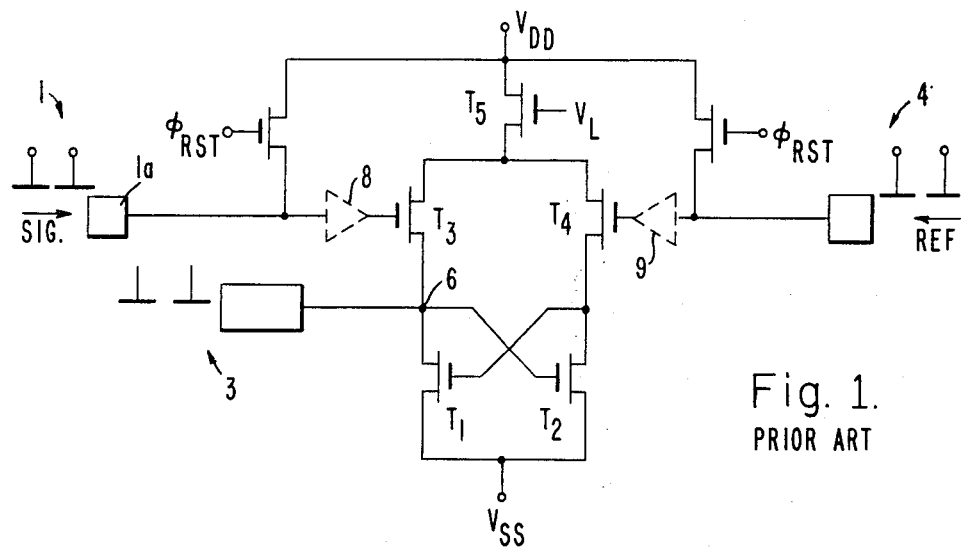
Fig. 1.
PRIOR ART
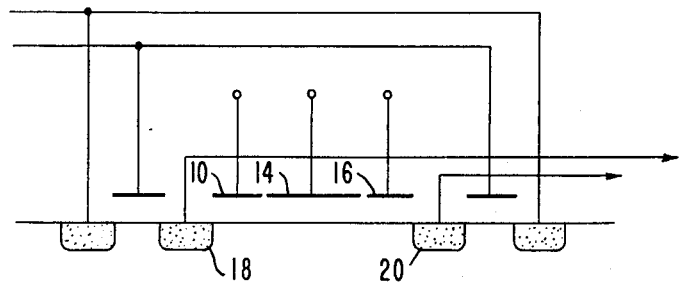
Fig. 2.
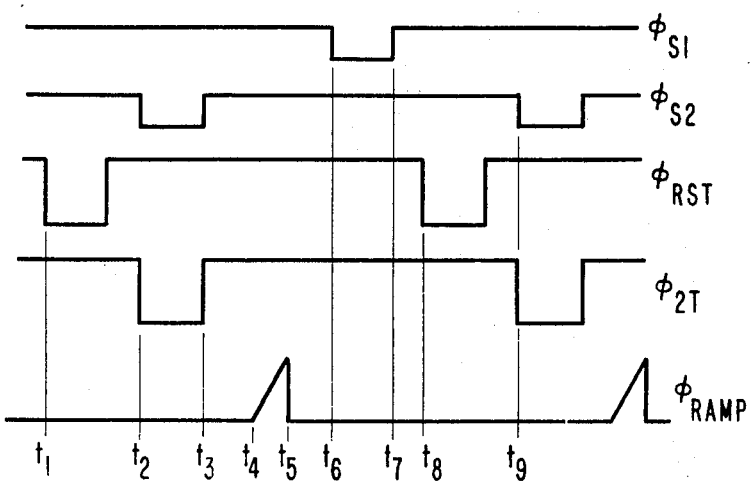

CHARGE COMPARATOR OUTPUT DRIVER

TECHNICAL FIELD

This invention is useful in charge transfer devices and specifically in charge coupled devices requiring a periodic refreshment of charge packets to compensate for limited charge transfer efficiency, in which charge refreshment must be accomplished at high speed with very low power consumption using feedback.

CROSS REFERENCE TO RELATED APPLICATIONS

This application is related to U.S. patent application Ser. No. 106,313, filed Dec. 21, 1979 by James M. Hamilton and Craig L. Carrison, entitled, "Charge Coupled Charge Comparator Refresher" and assigned to the Assignee of the present application.

BACKGROUND OF THE INVENTION

Various charge refreshment techniques are well known in the art which are useful for refreshing charge packets serially transferred in a charge coupled device (CCD) and which dissipate in amplitude and definition due to the limited charge transfer efficiency and leakage current of the charge coupled device. Such charge refresher devices introduce a charge packet of superior definition and amplitude in place of the dissipated charge packet, and the refreshed charge packet continues to be transferred serially in the CCD register in place of the original dissipated charge packet. Prior art charge refresher devices include bistable latches which compared the original charge packet with a reference level to determine whether or not the charge packet represents a one or a zero, this comparison determining which of two states the latch assumes. The output of the latch either generates a logic 1, causing a refreshed charge packet to be injected into the charge coupled device in place of the original packet, or a logic 0, in which no charge is injected into the charge coupled device. The charge refresher must compare a serial succession of charge packets in a periodic manner to generate a corresponding serial succession of output refreshed charge packets injected into the charge coupled device. One problem with this type of charge refresher is that the output nodes and the feedback nodes of the bistable latch are shared so that the output current is divided between the output and the feedback, thus reducing the output voltage and reducing the speed of the device. Furthermore, such devices typically consume dc electrical power when latched. One solution to these problems is the charge coupled device charge comparator refresher of the Hamilton and Carrison patent application referenced above, in which charge refreshment is performed without requiring a bistable latch or similar active device, thus eliminating the problem of dividing current between output and feedback nodes and the problem of high dc electrical power consumption.

However, unless a bistable latch or equivalent device is used, the speed of the charge refresher circuit is reduced, since the switching speed of a bistable latch is typically greater than the speed of the comparator refresher of the Hamilton and Carrison Application.

SUMMARY OF THE INVENTION

The foregoing problems of the prior art are overcome in the present invention in which charge refreshment is accomplished at high speed using a resettable bistable latch. However, the problems of prior art bistable latches are avoided by isolating the feedback nodes and the output nodes of the latch in the present invention and by preventing the consumption of direct current electrical power to provide a charge refresher device of improved speed and low power consumption. The invention is a charge coupled device which includes a CCD source diffusion providing a source of charge flow controlled by a ramp gate feeding either one or the other of two charge flow channels controlled by a signal gate and a reference gate, respectively. The charge flows into either one or the other of the two channels depending upon whether or not the voltage applied to the signal gate is less than or greater than the voltage applied to the reference gate. The voltage on the signal gate is determined by the size of the original signal charge packet to be refreshed while the voltage applied to the reference gate is a selected reference level.

In order to increase the device speed, latching feedback is provided without diverting any charge flowing to either one of the two output channels by providing a bistable latch comprising first and second field effect transistors (FET's) having their sources connected to the CCD source diffusion, the drain of the first transistor connected to the reference gate and the drain of the second transistor connected to the signal gate. In order to provide feedback, the gate of the first transistor is connected to the signal gate and the gate of the second transistor is connected to the reference gate. In this manner, latching feedback is provided while maintaining the output nodes, namely the first and second output charge flow channels, and the feedback nodes, namely the gates of the first and second field effect transistors, isolated from one another so that substantially no output charge flowing into the first and second charge flow channels is diverted for the purpose of providing feedback. Furthermore, there is no consumption of direct current electrical power. Thus, a vast improvement over the prior art bistable latching charge refreshment circuits is provided, having the advantage of high speed facilitated by the novel latching mechanism of the present invention and having the advantage of isolated output and feedback nodes for low power consumption which had previously been achieved in the device disclosed in the Hamilton and Carrison patent application, referenced above, by sacrificing the advantage of latching feedback now provided in the present invention.

A further improvement is achieved in the preferred embodiment of the present invention in which one of the two feedback transistors is eliminated, thus simplifying the construction of the device to reduce cost and complexity and improving sensitivity. The present invention may find wide use not only as a solution to the logic fanout problem of charge coupled device logic circuits discussed in the Hamilton and Carrison patent application referenced above, but also finds an even broader use in all types of charge coupled devices needing charge refreshment and general electronic devices requiring resettable bistable latches having low power consumption in which the feedback and output nodes are isolated from one another. Alternatively, the invention may be constructed exclusively with metal oxide semiconductor field effect transistors (MOSFET's) to provide a comparing bistable latching device of general utility.

BRIEF DESCRIPTION OF THE DRAWINGS

The invention is best understood by reference to the accompanying drawings, of which:

FIG. 1 is a schematic diagram of a prior art charge refreshing circuit for charge coupled devices which uses a bistable resettable latch;

FIG. 2 is a simplified schematic diagram of the CCD charge comparator refresher disclosed in the Hamilton and Carrison patent application referenced above;

FIG. 3b is a simplified plan view of a portion of the device of FIG. 3a;

FIG. 4 includes illustrations of the clock signals utilized by the circuit of FIG. 3, in which:

FIG. 4a illustrates the time domain waveform of the clock signal $\phi_{s1}$;

FIG. 4b illustrates the time domain waveform of the clock signal $\phi_{s2}$;

FIG. 4c illustrates the time domain waveform of the clock signal $\phi_{rst}$;

FIG. 4d illustrates the time domain waveform of the clock signal $\phi_{2t}$;

FIG. 4e illustrates the time domain waveform of the clock signal $\phi_{ramp}$ applied to the ramp gate of FIG. 3;

DETAILED DESCRIPTION OF THE INVENTION

Figure 3A:
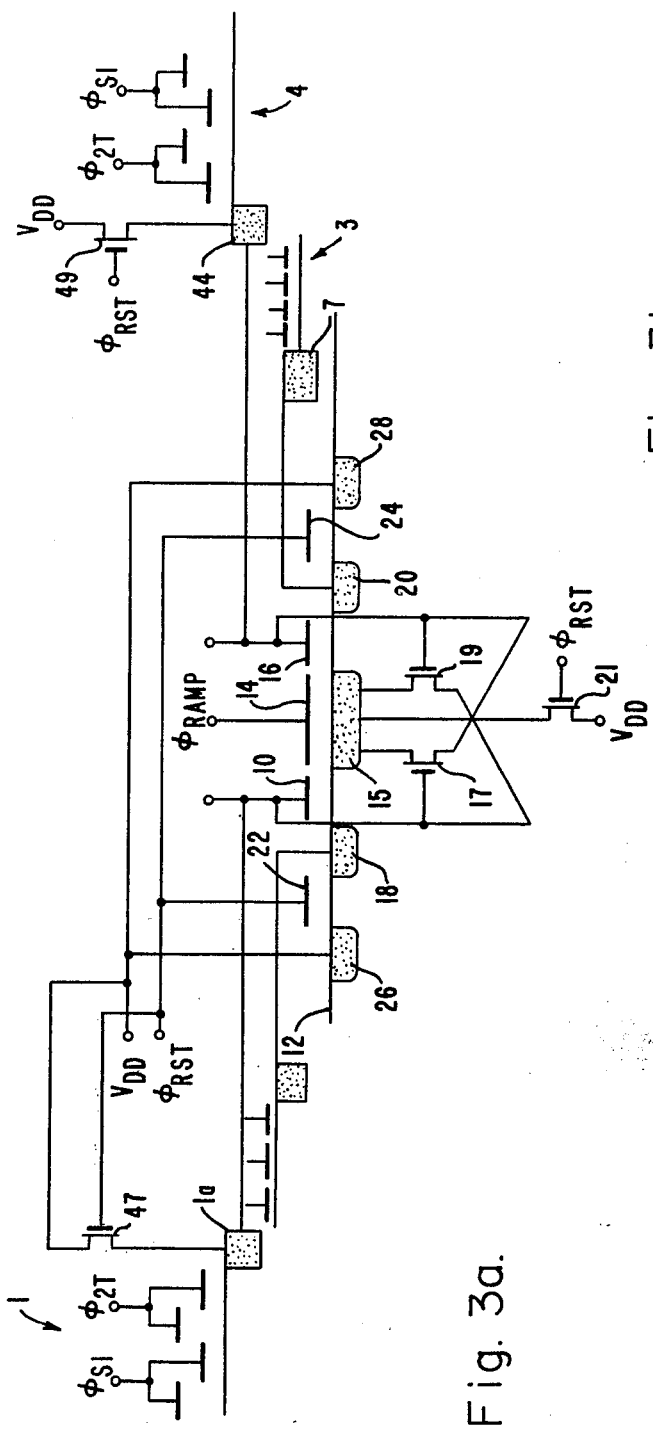
FIG. 3a is a simplified schematic diagram of the charge comparator output driver of the present invention.

Referring to the prior art charge refreshing circuit of FIG. 1, charge packets transferred from left to right in an input CCD register 1 generate refreshed charge packets of improved definition and amplitude by the action of a bistable latch comprising field effect transistors $T_1$, $T_2$, $T_3$, $T_4$, and the refreshed charge packets are injected into a CCD output register 3. The original charge packet to be refreshed enters a floating diffusion 1a causing a voltage to be applied to the gate of the transistor $t_3$ while the reference voltage is applied to the gate of the transistor $t_4$. The drains of the transistors $t_3$ and $t_4$ are connected together and their sources are connected to drains of the transistors $t_1$ and $t_2$, respectively, while the sources of the transistors $t_1$ and $t_2$ are connected together. Latching feedback is provided by connecting the source of the transistor $t_3$ to the gate of the transistor $t_2$ and connecting the source of the transistor $t_4$ to the gate of the transistor $t_1$. Whenever the field effect transistor $t_5$ is turned on, a voltage $V_{dd}$ is applied to the drains of the transistors $t_3$ and $t_4$, so that current will flow through either the transistor pair $t_3$ and $t_1$ or through the transistor pair $t_4$ and $t_2$, depending upon whether the gate voltage of the transistor $t_3$ is less than or greater than the gate voltage of the transistor $t_4$, respectively. Thus, a logic "1" is generated at the source of the transistor $t_3$ only if the charge packet sensed in the input diffusion 1a exceeds the reference voltage applied to the gate of the transistor $t_4$ to generate a refreshed charge packet injected into the CCD output register 3. The efficiency of the prior art charge refreshing circuit of FIG. 1 is limited because the current on its output node 6 is divided between the current applied to the input of the CCD register 3 and the current applied as feedback to the gate of the transistor $t_2$. Typically, the node 6 has a large output capacitance which limits the output voltage applied to the input of the CCD register 3 and also limits the speed at which the latching circuit will switch. In one variation of the prior art circuit of FIG. 1, the speed of the device is increased by providing source follower amplifiers 8 and 9 (shown in dashed line in FIG. 1) to increase the voltage applied to the gates of the transistors $t_3$ and $t_4$. However, it was found that, with the introduction of the source follower amplifier 8 and 9, operation of the circuit of FIG. 1 was centered about a large offset voltage with respect to the voltage difference between the gates of the transistors 2a and 2b, thus introducing a larger error in the comparison of the signal charge packet with the reference level voltage, a significant disadvantage.

As described in the above referenced patent application entitled, "Charge Coupled Device Charge Comparator Refresher", by James M. Hamilton and Craig L. Carrison, one solution to the foregoing problems is the charge coupled device illustrated in FIG. 2 of this application in which charge refreshment and charge amplification is performed without requiring a bistable latch and without consuming direct current electrical power. As described in the Hamilton and Carrison Application, charge ejected from beneath the ramp gate 14 of FIG. 2 flows into a first charge flow channel beneath the signal gate 10 or into a second charge flow channel beneath the reference gate 16 depending upon whether the charge packet to be refreshed generates a voltage on the signal gate which is greater than or less than the voltage on the reference gate 16, respectively. One disadvantage of the improved device of FIG. 2 is that the latching circuit of FIG. 1 is eliminated, thus sacrificing speed in order to gain other advantages.

Figure 3B:
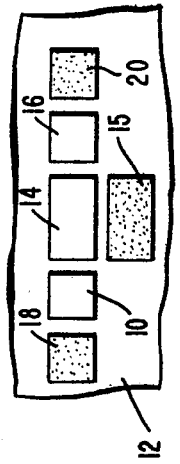

Referring to the schematic diagram of the present invention of FIG. 3a, charge refreshment is accomplished with a latching function to enhance the speed of the device while avoiding the disadvantages of the prior art latching circuit of FIG. 1. Unlike the prior art latching charge refreshing circuit of FIG. 1, the output nodes and the feedback nodes of the present invention illustrated in FIG. 3a are isolated from one another, thus avoiding the necessity of dividing the current at the output nodes between the current furnished to the CCD output register 3 and the feedback current providing the latching function. Thus, in a semiconductive substrate 12 of n-type conductivity, a p-type ramp diffusion 15 is adjacent the ramp gate 14 (as shown in FIG. 3b) and is connected to the sources of two metal oxide semiconductive field effect transistors 17, 19 having their gates connected to the signal gate 10 and the reference gate 16 respectively, the drain of the transistor 17 being connected to the gate of the transistor 19 and the drain of the transistor 19 being connected to the gate of the transistor 17 to provide the requisite feedback nodes. The source diffusion 15 is reset to the voltage $V_{dd}$ through a reset transistor 21.

Each charge packet transferred from left to right in the signal CCD register 1 is sensed in the floating diffusion 1a, causing a voltage proportional to the size of the charge packet to be applied to the signal gate 10. Simultaneously, the reference voltage is applied to the gate 16 from a reference source which, for example, may be a reference CCD register 4 transferring reference charge packets which are sensed in a floating diffusion 4a. The ramp gate 14 initially creates a potential well in the underlying portion of the substrate 12 so that charge is attached from the diffusion 15 and stored beneath the gate 14. Subsequently, the voltage on the ramp gate 14 is increased linearly with time so that the charge stored is ejected and passes beneath either the signal gate 10 into the input diffusion 18 or beneath the reference gate 17 into the input diffusion 20, depending upon whether the signal voltage applied to the signal gate 10 is less than or greater than the reference voltage applied to the reference gate 16, respectively. If the charge packets sensed in the floating diffusion 1a in the input register 1 exceeds the reference level defined by the voltage applied to the reference gate 16, the charge ejected from source beneath the ramp gate 14 will flow beneath the reference gate 16 into the input diffusion 20 (an output node) to be injected into the output register 3 as a refreshed charge packet corresponding to the charge packet sensed in the input register 1.

The speed at which charge may be ejected under control of the linearly increasing voltage applied to the ramp gate 14 is significantly increased by the latching feedback function in which the higher voltage applied to the signal gate 10 is also applied to the gate of the transistor 17 to cause the transistor 17 to have a lower source-to-drain conductivity, while the relatively lower reference voltage applied to the reference gate 16 is also applied to the gate of the transistor 19 causing it to have a relatively greater source-to-drain conductivity. As a result, the voltage on the signal gate is increased by virtue of its connection through the transistor 19 to the source diffusion 15, quickly decreasing the tendency of the charge ejected from beneath the ramp gate 14 to flow beneath the signal gate 10.

If, on the other hand, the original charge packet sensed in the floating diffusion 1a of the input register 1 is of insufficient size, the voltage applied to the signal gate 10 will be less than the voltage applied to the reference gate 16 so that the charge ejected from beneath the ramp gate 15 will flow instead beneath the signal gate 10 to be injected into another output register 7'. In this case, the greater voltage is applied to the gate of the transistor 19 while the lesser voltage is applied to the gate of the transistor 17, causing the potential on the reference gate 16 to be further increased by virtue of its connection through the source and drain of the transistor 17 to the source diffusion 15, further decreasing the tendency of the ejected charge to flow beneath the reference gate 16. Thus, it is seen that feedback to the transistors 17 and 19 rapidly forces the flow of charge beneath either the signal gate 10 or the reference gate 16. As a result, the linearly increasing voltage applied to the ramp gate 14 may be increased at a more rapid rate to more rapidly eject charge from the potential well beneath the ramp gate 14 so that the speed of the charge coupled device of FIG. 3a is significantly increased.

After each comparison, the source diffusion 15 and the two input diffusions 18 and 20 are reset to the voltage $V_{dd}$. Thus, reset gate 22 is provided between the left input diffusion 18 and a reset diffusion 26 while reset gate 24 is provided between the right input diffusion 20 and reset diffusion 28. A reset clock $\phi_{rst}$ is applied to the reset gates 22 and 24 while the reset diffusions 26 and 28 are held at a voltage $V_{dd}$. Similarly, the reset clock $\phi_{rst}$ is applied to the gate of the reset transistor 21 to simultaneously set the source diffusion 15 to the voltage $V_{dd}$.

Figure 5:
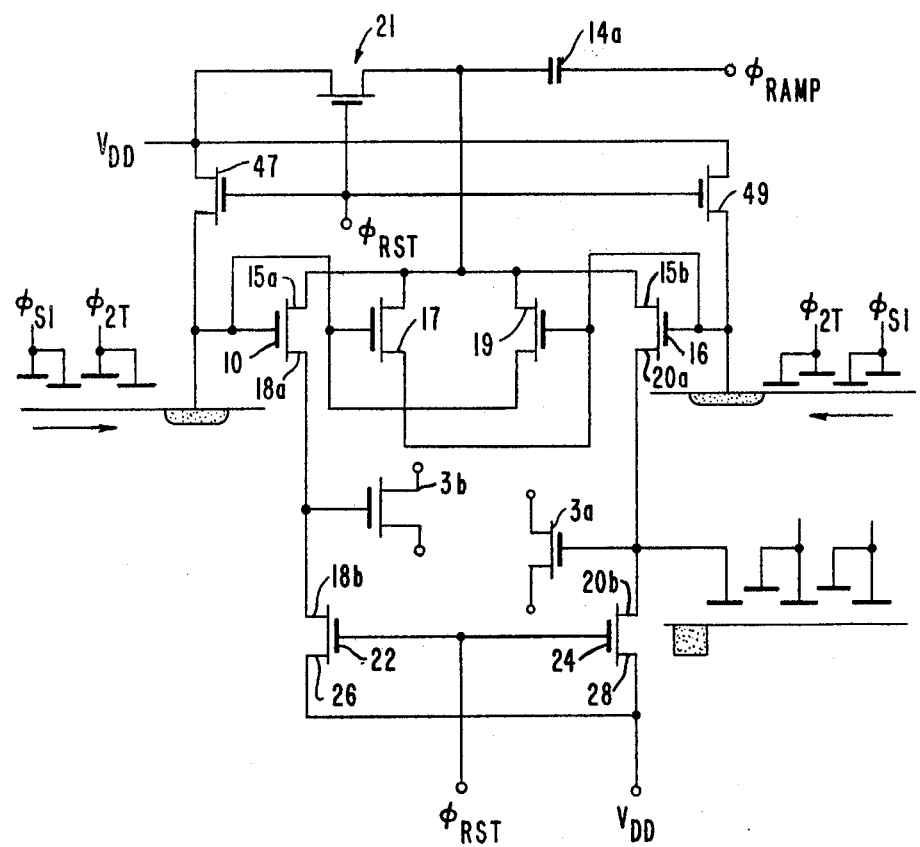
FIG. 5 is a schematic diagram of a device equivalent to the charge comparator output driver of FIG. 3 but constructed using metal oxide semiconductor field effect transistors.

The charge refreshing output driver of FIG. 3 may also be constructed using individual metal oxide semiconductor (MOS) field effect tansistors, as illustrated in FIG. 5. The circuit of FIG. 5 is exactly equivalent to the charge transfer device of FIG. 3a with the differences that the source diffusion 15 is divided into two sources 15a and 15b while the input diffusions 18 and 20 of FIGS. 3a and 3b are divided into drain diffusions 18a, 20a and source diffusions 18b, 20b, respectively. The ramp gate 14 of FIGS. 3a and 3b comprises a capacitor 14a in FIG. 5. The device of FIG. 5 may inject charge into the output CCD registers 3 annd 3', and may control output transistors 3a and 3b. Thus, it is seen that the invention finds use as both a charge transfer device and as a MOS field effect transistor (MOSFET) device.

Figure 6:
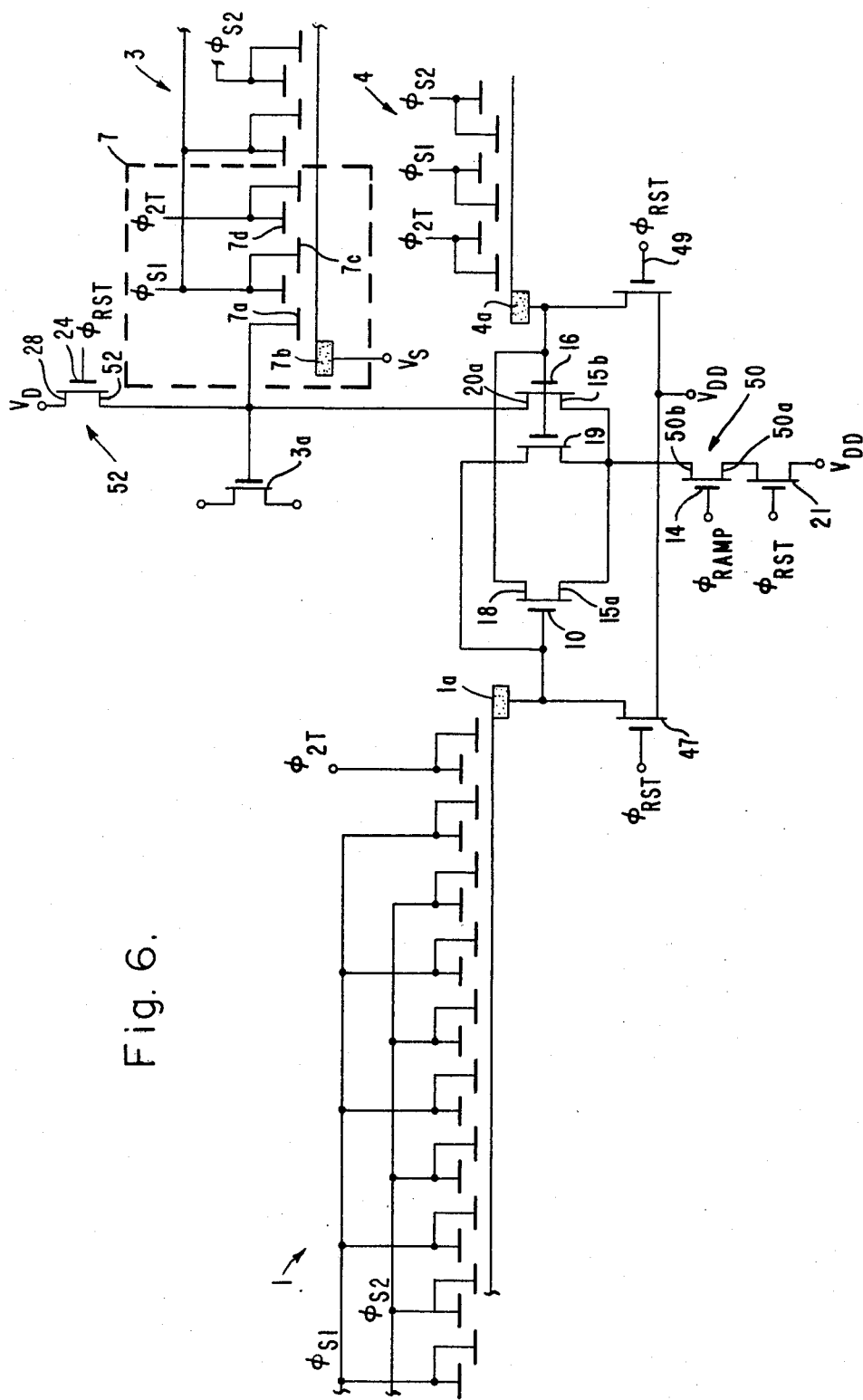
FIG. 6 is a schematic diagram of the preferred embodiment of the charge comparator output driver of the present invention.

The preferred embodiment of the CCD output driver of the present invention is illustrated in the schematic diagram of FIG. 6 and is similar to the CCD comparator output driver of FIGS. 3a, and 5 except that the feedback transistor 17 has been eliminated, improving sensitivity and reducing the complexity and cost of the device while maintaining the advantage of high switching speed due to the function of the feedback latching transistor 19. The charge comparator output driver of FIG. 6 also differs from that of FIGS. 3a and 5 in that the ramp gate 14 is the gate of a MOSFET 50 comprising a source 50a and a drain 50b which is connected to both the sources 15a and 15b. However, it should be understood that the ramp gate is preferably of a large area so that it may create a potential well in the substrate surface potential beneath it storing a large amount of charge to provide a charge amplification function. The reset transistor 21 is connected to the source 50a. Operation of the charge comparator output driver of FIG. 6 is similar to the operation described in connection with FIGS. 3a and 5 in that, as the potential applied to the ramp gate is increased in magnitude, charge is ejected from the potential area beneath the ramp gate 14 to flow under either the signal gate 10 or the reference gate 16 depending upon whether the voltage applied to the signal gate 10 is less than or greater than the voltage applied to the reference gate 16, respectively.

If the charge pocket transferred from left to right in the input register 1 of FIG. 6 and sensed in the floating diffusion 1a causes a voltage to be applied to the signal gate which is in excess of the reference voltage applied to the reference gate 16, the source-to-drain conductivity beneath the signal gate 10 is less than that beneath the reference gate 16 so that the charge flowing from beneath the ramp gate 14 flows beneath the reference gate 16 and also flows through the source and drain of the feedback transistor 19 to the signal gate 10, further decreasing the source-to-drain conductivity beneath the signal gate 10. In this manner the transistor comprising the signal gate 10, the source 15a and drain 18 is quickly cut off. As a result, the sawtooth waveform applied to the ramp gate 14 may have a significantly higher slope so that charge may be ejected from beneath the ramp gate 14 to the source diffusions 15a, 15b at a high rate for significantly faster operation than the comparator-refresher of the above-referenced Hamilton and Carrison patent application.

If, on the other hand, the charge packet sensed by floating diffusion 1a in the input CCD register 1 induces a voltage below the reference voltage applied to the reference gate 16, then the reference gate 16 and the gate of the feedback transistor 19 will both be at a potential higher than the potential of the signal gate 10 so that the charge ejected from beneath the ramp gate 14 will flow through the source diffusion 15a and beneath the signal gate 10 to the drain diffusion 18. The drain diffusion 18 is connected in turn to the reference gate 16 and to the gate of the feedback transistor 19, so that the charge passing beneath the signal gate 10 is applied as feedback to the reference gate 16, further reducing the source-to-drain conductivity beneath the reference gate 16. In this manner the transistor comprising the reference gate 16, the source diffusion 15b and the drain diffusion 20a is quickly cut off. Significantly, the output node comprising the drain 20a is isolated from the feedback nodes 10, 16 so that essentially none of the output current is diverted to provide feedback current, significantly enhancing the device performance.

The output current from the output diffusion 20a is applied to a charge injection device 7 at the entrance to the output CCD register 3 in the manner discussed above in connection with FIGS. 3 and 5. Although the charge injector 7 may be of any type well known in the art, including the type discussed in the Hamilton and Carrison patent application referenced above, in the preferred embodiment of FIG. 6 the charge injector 7 performs an inverting function in which the output signal from the diffusion 20a is applied to a gate 7a controlling the injection of charge from an input diffusion 7b. Whenever the output driver of FIG. 6 is latched in such a manner as to provide a current to the output diffusion 20a, a repulsive voltage is applied to the control gate 7a in the charge injector 7, preventing the injection of charge into the output register 3. Conversely, whenever the output driver of FIG. 6 latches in such a manner as to provide no current to the output diffusion 20a, no repulsive voltage is applied to the control gate 7a so that charge may be injected from the source diffusion 7b into a potential well under the clocked electrodes 7c, 7d, to enter the output CCD register 3 as an output charge packet. Thus, whenever a charge packet (logic "1") is sensed in the input register 1, no charge packet (logic "0") is injected into the output register 3, while if no charge packet (logic "0") is sensed in the input register 1, a refreshed charge packet (logic "1") will be injected into the output register 3.

After each comparison is performed by the output driver of FIG. 6, a reset clock $\phi_{rst}$ is applied to the gate 24 of a transistor 52 comprising the reset diffusion 28 and a diffusion 52a to reset the potential of the control gate 7a to an attractive voltage $V_{dd}$. Simultaneously, the clock signal $\phi_{rst}$ is also applied to the reset transistors 21, 47 and 49 to reset the diffusions 50a, 1a and 4a in the manner described above in connection with FIGS. 3 and 5.

Operation of the preferred embodiment of FIG. 6 will now be described by reference to the time domain waveforms of the clock signals illustrated in FIGS. 4a-e. At time $t_1$ of FIG. 4, the clock signal $\phi_{rst}$ is pulsed negatively, causing a voltage $V_d$ to be applied through the reset transistor 52 to the control gate 7a and a voltage $V_{dd}$ to be applied through the reset transistors 46 and 49 to the floating diffusions 1a and 4a respectively. Simultaneously, the voltage $V_{dd}$ is applied through the reset transistor 21 to reset the voltage of the source 50a of the ramp transistor 50. At this time, the voltage applied to the ramp gate 14 at time $t_1$, creates an underlying potential well in the substrate surface potential so that charge equilibration is achieved between the diffusion 50a and the underlying potential well to store charge beneath the ramp gate 14.

At time $t_2$ the clock signal $\phi_{2t}$ is pulsed negatively, causing a signal charge packet (transferred from left to right in the input CCD register 1) to be stored beneath CCD electrodes adjacent the floating diffusion 1a, and causing a reference charge packet (transferred from right to left in the reference CCD register 4) to be stored beneath the electrodes adjacent the floating diffusion 4a. At time $t_3$ the clock signal $\phi_{2t}$ is turned off, causing the signal charge to enter the floating diffusion 1a and the reference charge packet to enter the floating diffusion 4a, so that signal voltage is applied to the signal gate 10 and a reference voltage is applied to the reference gate 16 and simultaneously to the gate of the feedback transistor 19. At time $t_4$, the clock signal $\phi_{ramp}$ applied to the ramp gate 14 begins to increase linearly toward a more positive voltage (+V), thus ejecting charge stored in the potential well beneath the ramp gate 14 to one of the two channels defined beneath the signal gate 10 and the reference gate 16, respectively. If the size of the charge packet stored in the floating diffusion 1a exceeds the size of the reference charge packet stored in the floating diffusion 4a, the voltage on the signal gate is greater than the voltage on the reference gate 16 and is greater than the voltage on the gate of the feedback transistor 19 so that the source-to-drain conductivity beneath the signal gate 10 is less than the source-to-drain conductivity beneath the reference gate 16 and is also less than the source-to-drain conductivity of the feedback transistor 19. Therefore, beginning at time $t_4$, the charge ejected from beneath the ramp gate 14 flows through the feedback transistor 19 and also flows beneath the reference gate 16. Simultaneously, the charge flowing through the feedback transistor 19 is applied as feedback to the signal gate 10, to further decrease the source-to-drain conductivity beneath the signal gate 10 so that the transistor comprising the signal gate 10, the source diffusion 15a and the drain diffusion 18 is cut off. Because the capacitance of the signal gate 10 is low, the current flowing through the feedback transistor 19 is insignificant so that virtually all of the current from beneath the ramp gate 14 flows beneath the reference gate 16 into the output diffusion 20a and is applied to the charge injection device 7 to impose a positive potential on the control gate 7a, and output transister 3a. (The transistor 3a is optional and can be used for obtaining conventional logic level signals for data output). Subsequently, at time $t_5$, the signal $\phi_{ramp}$ applied to the ramp gate 14 is turned off after charge ceases flowing from under the ramp gate 14 due to a loss of all the charge originally stored stored under the ramp gate 14.

At time $t_6$, when the clock signal $\phi_{s1}$ is pulsed negatively to create a potential well beneath the gates 7c and 7d of the output register 3, no charge will be injected beneath the control gate 7a from the source diffusion 7b into the potential well under the gate 7d. Therefore, an empty bucket exists in the potential well beneath the gates 7c and 7d. After time $t_7$ when the clock signal $\phi_{s1}$ is turned off and at time $t_9$ when the clock signal $\phi_{s2}$ is turned on, this empty bucket is transferred from left to right in the output register 3, comprising a logic "0" corresponding to the inverse of the logic "1" sensed in the input register 1.

In the alternate operational sequence, the charge packet sensed in the floating diffusion 1a is less than the reference charge packet sensed in the floating diffusion 4a (a logic "0"), and the voltage applied to the signal gate 10 is less than the reference voltage applied to the reference gate 16 and to the gate of the feedback transistor 19, so that the charge ejected from beneath the ramp gate 14 between time $t_4$ and time $t_5$ flows instead from beneath the signal gate 10 from the source diffusion 15a to the drain diffusion 18 and is applied directly to the reference gate 16 and to the gate of the feedback transistor 19 as feedback to latch the feedback transistor 19 "off" and, more importantly, to latch the output transistor (comprising the reference gate 16, the source diffusion 15b and the drain diffusion 20a) "off" so that no signal is applied to the charge injection electrode 7a, thus allowing the charge injection control electrode 7a to remain at the attractive potential $V_d$ (at which it was previously set at time $t_1$ by the reset transistor 52). As a result, at time $t_6$ when the clock signal $\phi_{s1}$ is pulsed negatively to create a potential charge storing well beneath the electrode 7d, charge will flow from the input diffusion 7b to fill this well, thus creating a charge packet (a logic "1") beneath the electrode 7d which is subsequently transferred from left to right after time $t_7$ when the clock signal $\phi_{s1}$ is turned off and at time $t_9$ when the clock signal $\phi_{s2}$ is turned on. Thus, the preferred embodiment illustrated in FIG. 6 functions as both a charge refresher for CCD's and as a logic inverter. However, other variations not shown in the figures described above may be practical alternatives which do not depart from the scope of the invention. For example, the invention may be modified so that it does not perform the logic inverter function. Also, the device may be fabricated as either a P-channel or as an N-channel device and used in any MOS technology. Furthermore, the individual MOSFET's illustrated in FIG. 6 may be replaced by one integrated bucket brigade charge transfer device.

What is claimed is:

1. A charge transfer device comparator refresher formed on the surface of a semiconductor substrate having a surface potential, comprising:
   an input source of charge packets to be refreshed;
   an output charge flow channel;
   a first voltage source;
   means for storing charge in a first portion of said surface in an amount proportional to the voltage of said first voltage source;
   means for forming a signal potential barrier having a height proportional to the size of charge packets to be refreshed from said input source;
   means for forming a reference potential barrier of a selected reference barrier height in said substrate surface potential;
   means for changing the voltage of said first voltage source to eject the charge stored by said charge storing means and overflow one of said signal and reference potential barriers whenever one of said signal and reference potential barrier heights is less than the other, respectively;
   means for injecting charge into said output charge flow channel in response to charge overflowing one of said signal and reference barriers; and
   latching means for setting one of said signal and reference barrier heights to be less than the other, said latching means having a feedback node isolated from said charge injecting means.

2. A charge transfer device comparator refresher formed on the surface of a semiconductive substrate having a substrate electrical surface potential, comprising:
   an input source of charge packets to be refreshed;
   an output charge flow channel;
   a first voltage source;
   means for storing an amount of charge proportional to the voltage of said first voltage source;
   a source of charge to be stored by said charge storing means;
   means for forming a signal potential barrier in said surface potential in response to said charge packets to be refreshed;
   means for forming a reference potential barrier of a selected reference height;
   means for changing the voltage of said first voltage source to eject the charge stored by said charge storing means and overflow one of said signal and reference potential barriers whenever one of said signal and reference barrier heights is less than the other, respectively;
   means for injecting charge into said flow channel in response to charge overflowing one of said signal and reference barriers; and
   a transistor comprising a source, a drain and a gate, one of said source and drain connected to said source of charge to be stored, the other of said source and drain connected to said signal barrier forming means and said gate connected to said reference barrier forming means.

3. The device of claim 2 further comprising a second field effect transistor comprising a second source, a second drain and a second gate, one of said second source and drain connected to said source of charge to be stored, the other of said second source and drain connected to said reference barrier forming means and said gate connected to said signal barrier forming means.

4. A charge transfer device comparator refresher formed on the surface of a semiconductive substrate having a substrate electrical surface potential comprising:
   a ramp electrode overlying said substrate surface;
   a first source of voltage applied to said ramp electrode;
   a charge storing potential well in said surface potential underlying said ramp electrode, said potential well having a charge storing potential depth proportional to the voltage of said first source;
   a source of charge to be stored in said charge storing potential well;
   an input source of charge packets to be refreshed;
   a signal electrode overlying said substrate adjacent said ramp electrode;
   means for applying a signal potential to said signal electrode proportional to the size of charge packets to be refreshed from said input source;
   a signal potential barrier in said surface potential underlying said signal electrode having a signal potential height proportional to said signal potential;
   a reference electrode overlying said substrate having an applied reference potential;
   a reference potential barrier in said surface potential underlying said reference electrode having a reference potential height proportional to said reference potential;
   an output charge flow channel;
   means for changing the voltage of said first voltage source to eject charge stored in said charge storing potential well beneath said ramp electrode and overflow one of said signal and reference potential barriers whenever one of said signal and reference potential barrier heights is less than the other, respectively;

means for injecting charge into said output charge flow channel in response to charge overflowing one of said signal and reference barriers; and a field effect transistor formed in said substrate comprising a source, a drain and gate, one of said source and drain connected to said source of charge to be stored, the other of said source and drain connected to said signal electrode and said gate connected to said signal electrode and said gate connected to said reference electrode.

5. The device of claim 4 further comprising a second field effect transistor formed in said substrate comprising a second source, a second drain and a second gate, one of second source and drain connected to said source of charge to be stored, the other of said second source and drain connected to said reference electrode, and said second gate connected to said signal electrode.

6. The device of claim 5 wherein said first and second field effect transistors comprise a bistable latch said first and second gate comprising feedback nodes which are isolated from said charge injection means through said first and second source and drains respectively.

* * * * *